United States Patent
Peng

(10) Patent No.: US 11,817,343 B2
(45) Date of Patent: Nov. 14, 2023

(54) DIELECTRIC GAP FILL

(71) Applicant: Taiwan Semiconductor Manufacturing Co., Ltd., Hsinchu (TW)

(72) Inventor: Yu-Yun Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 288 days.

(21) Appl. No.: 17/222,012

(22) Filed: Apr. 5, 2021

(65) Prior Publication Data

US 2021/0225692 A1 Jul. 22, 2021

Related U.S. Application Data

(63) Continuation of application No. 16/007,161, filed on Jun. 13, 2018, now Pat. No. 10,971,391.

(51) Int. Cl.
| | | |
|---|---|---|
| H01L 21/762 | (2006.01) | |
| H01L 29/06 | (2006.01) | |
| H01L 27/088 | (2006.01) | |
| H01L 21/8234 | (2006.01) | |
| H01L 21/02 | (2006.01) | |

(52) U.S. Cl.
CPC .... *H01L 21/76224* (2013.01); *H01L 21/0228* (2013.01); *H01L 21/02126* (2013.01); *H01L 21/02323* (2013.01); *H01L 21/823431* (2013.01); *H01L 21/823481* (2013.01); *H01L 27/0886* (2013.01); *H01L 29/0649* (2013.01)

(58) Field of Classification Search
None
See application file for complete search history.

(56) References Cited

U.S. PATENT DOCUMENTS

| | | |
|---|---|---|
| 9,812,319 B1 | 11/2017 | Fukazawa et al. |
| 10,211,314 B1 | 2/2019 | Hsu et al. |
| 2005/0142795 A1 | 6/2005 | Ahn et al. |
| 2006/0046425 A1 | 3/2006 | Sandhu |
| 2014/0159193 A1 | 6/2014 | Kim et al. |
| 2015/0179503 A1 | 6/2015 | Tsai et al. |
| 2015/0255274 A1 | 9/2015 | Yamamoto et al. |
| 2015/0372144 A1 | 12/2015 | Fang et al. |
| 2017/0186642 A1 | 6/2017 | Kim et al. |

(Continued)

FOREIGN PATENT DOCUMENTS

| | | |
|---|---|---|
| CN | 102655111 A | 9/2012 |
| CN | 106935542 A | 7/2017 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

Generally, examples are provided relating to filling gaps with a dielectric material, such as filling trenches between fins for Shallow Trench Isolations (STIs). In an embodiment, a first dielectric material is conformally deposited in a trench using an atomic layer deposition (ALD) process. After conformally depositing the first dielectric material, the first dielectric material is converted to a second dielectric material. In further examples, the first dielectric material can be conformally deposited in another trench, and a fill dielectric material can be flowed into the other trench and converted.

20 Claims, 15 Drawing Sheets

(56) References Cited

U.S. PATENT DOCUMENTS

| | | |
|---|---|---|
| 2017/0194424 A1 | 7/2017 | Huang et al. |
| 2018/0097091 A1 | 4/2018 | Cheng et al. |
| 2018/0130800 A1 | 5/2018 | Huang et al. |
| 2018/0212040 A1 | 7/2018 | Bao et al. |
| 2018/0315835 A1* | 11/2018 | Cheng ................ H01L 29/7827 |
| 2019/0319118 A1 | 10/2019 | Lee et al. |
| 2019/0341450 A1 | 11/2019 | Lee et al. |
| 2020/0328289 A1* | 10/2020 | Cheng ................ H01L 21/0214 |

FOREIGN PATENT DOCUMENTS

| | | |
|---|---|---|
| KR | 20060099185 A | 9/2006 |
| KR | 101077014 B1 | 10/2011 |
| KR | 20140075173 A | 6/2014 |
| KR | 20170075854 A | 7/2017 |
| KR | 20180005630 A | 1/2018 |
| KR | 20180036621 A | 4/2018 |
| WO | 2018164655 A1 | 9/2018 |

\* cited by examiner

DIELECTRIC GAP FILL

PRIORITY CLAIM AND CROSS-REFERENCE

This application is a continuation of U.S. patent application Ser. No. 16/007,161, filed on Jun. 13, 2018, now U.S. Pat. No. 10,971,391, which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
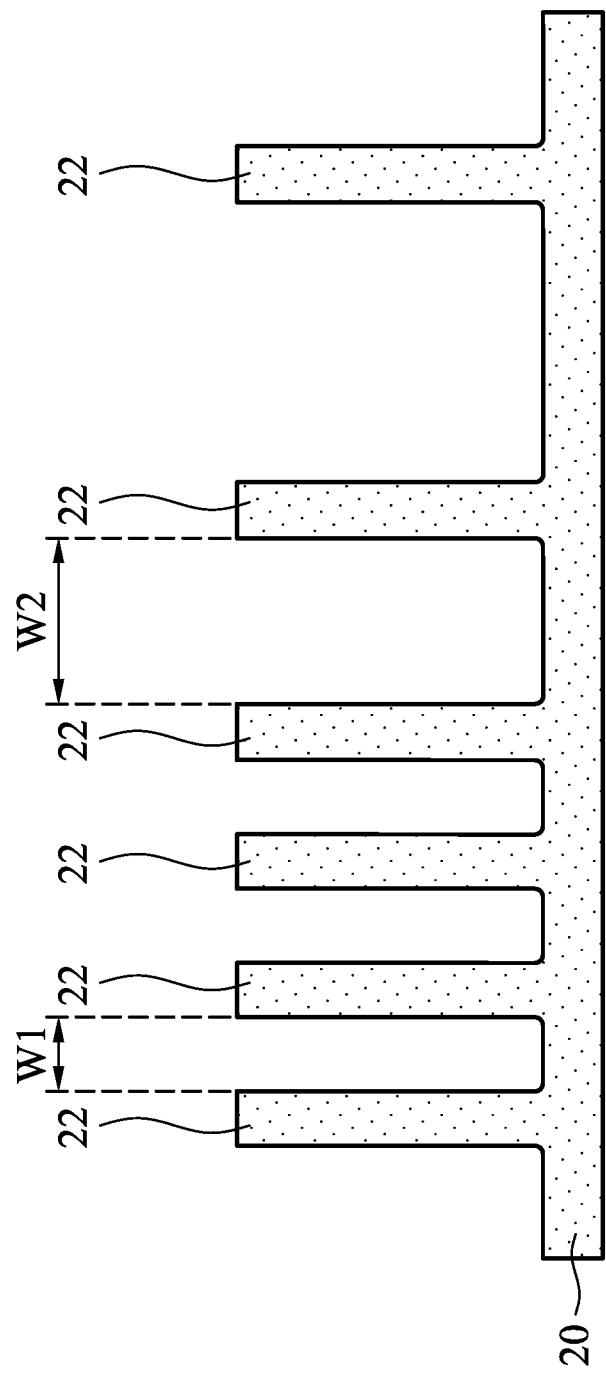
FIGS. 1A-1B, 2, 3, 4, 5A-5B, 6, 7A-7B, and 8A-8B are views of respective intermediate structures at respective stages during an example process for forming Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to filling gaps with a dielectric material. More specifically, example embodiments described herein relate to filling gaps having narrow dimensions with a dielectric material without a seam or void being formed in the dielectric material. In some examples, an atomic layer deposition (ALD) process is used to deposit a dielectric material in a gap, such as a trench between fins. A subsequent process converts the dielectric material to another dielectric material. As examples, the subsequent process may include an anneal in an oxygen-containing ambient, a gas soak in an oxygen-containing ambient, a plasma containing oxygen, and/or an ultraviolet (UV) treatment in an oxygen-containing ambient. The converted dielectric material may fill the gap without a seam or void formed therein in some examples. In examples where the converted dielectric material is formed in trenches between fins, bending of the fins can be reduced or obviated. Other benefits can be achieved.

Example embodiments described herein are described in the context of forming isolation regions, such as Shallow Trench Isolations (STIs), between fins in Front End Of the Line (FEOL) processing. The fins may be used to form Fin Field Effect Transistors (FinFETs). Other embodiments may be implemented in other contexts. Example embodiments may have broad applicability to any gap, trench, recess, opening, or the like that is to be filled with a dielectric material. Such gaps, etc. can be formed and filled in FEOL process, Middle End Of the Line (MEOL) processing, and Back End Of the Line (BEOL) processing. Aspects of the present disclosure may be implemented in any context where a gap, etc. is to be filled with a dielectric material.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1B:
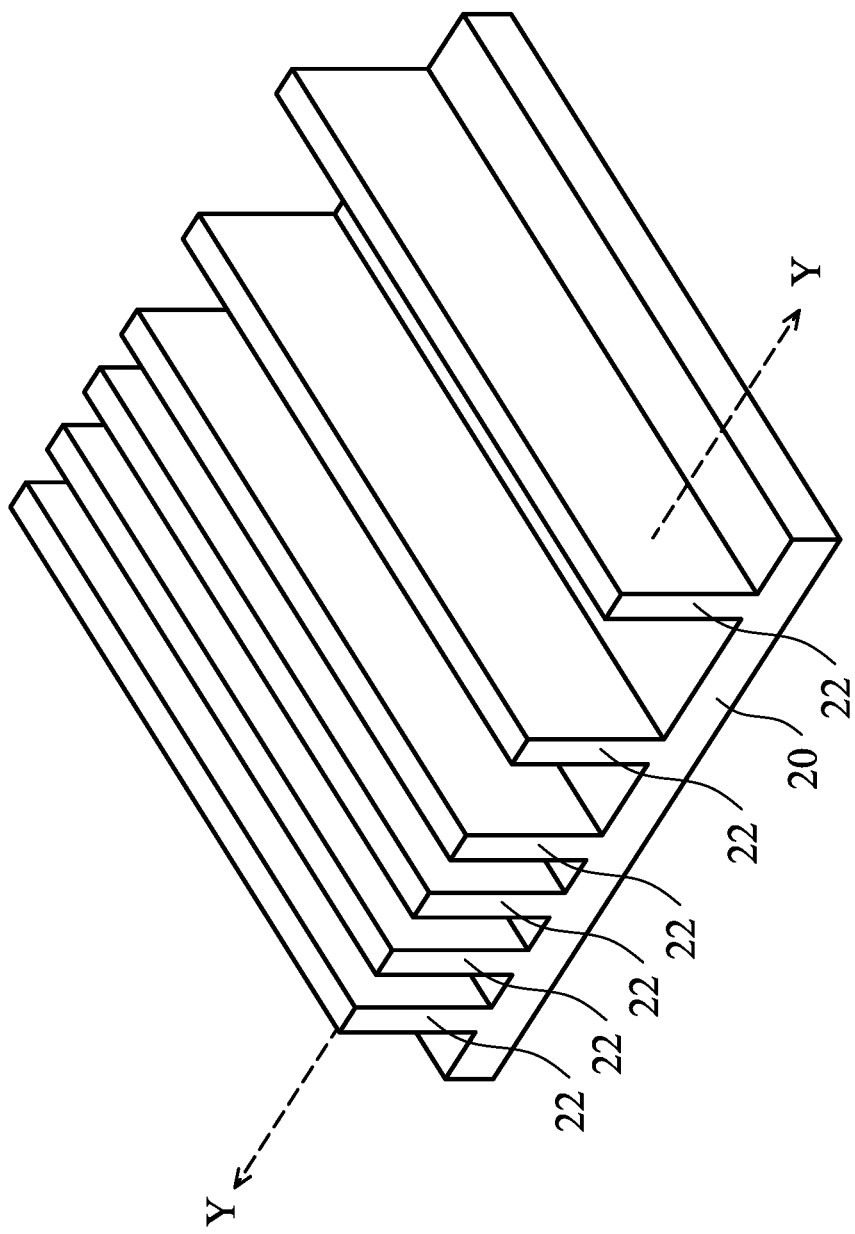

FIGS. 1A-1B through 8A-8B illustrate views of respective intermediate structures at respective stages during an example process for forming FinFETs in accordance with some embodiments. FIG. 1A illustrates a cross-sectional view of an intermediate structure at a stage of the example method, and FIG. 1B is a perspective view of the intermediate structure.

The intermediate structure includes fins 22 formed on a semiconductor substrate 20. The semiconductor substrate 20 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 20 may include an elemental semiconductor such as silicon (Si) or germanium (Ge); a compound semiconductor including; an alloy semiconductor; or a combination thereof.

The fins 22 are formed on the semiconductor substrate 20, such as by etching trenches in the semiconductor substrate 20 to form the fins 22. The fins 22 may be patterned in the semiconductor substrate 20 by any suitable method. For example, the fins 22 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 22.

FIG. 1A illustrates an example first width W1 and an example second width W2 of trenches etched into the semiconductor substrate 20 to form the fins 22. The first width W1 may be a small dimension, such as less than or equal to about 10 nm (e.g., in a range from about 3 nm to about 10 nm). One or more trenches having the first width W1 may have a high aspect ratio (e.g., depth of the trench to the first width W1), such as equal to or greater than 10. The second width W2 may be larger than the first width W1. In some examples, the second width W2 is at least 10 nm larger than the first width W1. In various examples, trenches can have various widths between neighboring fins 22, which can be in any configuration or pattern of widths. The illustrations in the figures are merely an example.

FIG. 1B further illustrates a reference cross-section Y-Y that corresponds to cross-sectional view of some figures. Cross-section Y-Y is in a plane across and intersecting the fins 22 on the semiconductor substrate 20. FIGS. 1A, 2 through 4, and 5A illustrate cross-sectional views at various instances of processing corresponding with the reference cross-section Y-Y.

Figure 2:
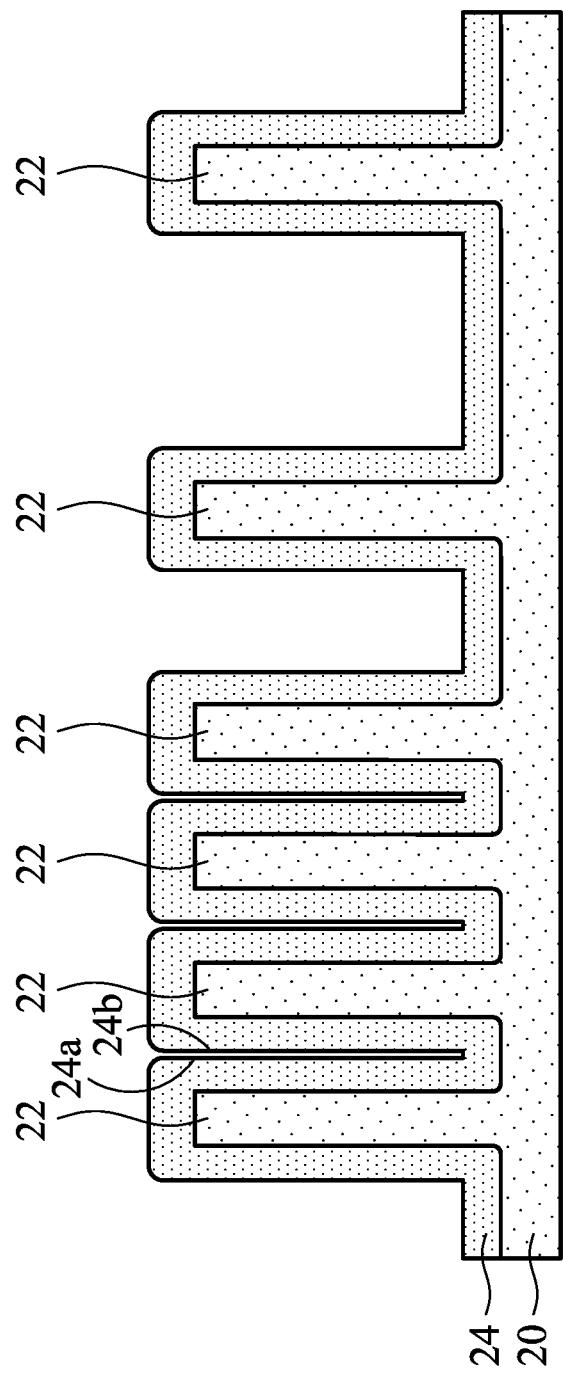

FIG. 2 illustrates the formation of a conformal dielectric material 24 on the fins 22 and in the trenches. The conformal dielectric material 24 in some examples includes a nitride or other dielectric material capable of being converted to an oxide. The conformal dielectric material 24 is deposited using an atomic layer deposition (ALD) process. As illustrated, the conformal dielectric material 24 as deposited does not fill the trenches between the fins 22.

The ALD process includes performing one or more cycles, where each cycle includes sequentially pulsing a precursor in a chamber, purging the chamber, pulsing a reactant in the chamber, and purging the chamber. The precursor is a gas that can include silicon and an organic group. In some examples, the precursor gas may be halogen-free or can further include a halogen, such as chlorine. In some examples, the precursor gas may be nitrogen-free or may further include nitrogen. For example, the organic group included in the precursor gas can be or include —$CH_2$ and/or —$CH_3$. In some examples, a single precursor gas (e.g., no mixture of precursor gases, but may include carrier gases) is used in the pulsing of the precursor gas of the ALD process.

Figure 9:
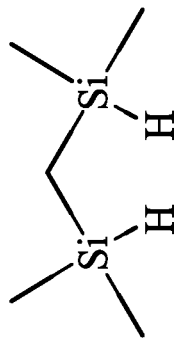
FIGS. 9 through 14 are schematic illustrations of compounds of various precursor gases.
Figure 10:
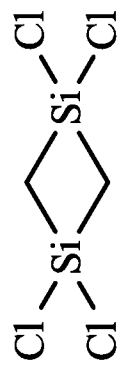

In some examples, a precursor gas includes silicon and an organic group, is halogen-free and nitrogen-free, and can have a general chemical formula of $Si(CH_2)Si(CH_3)_xH_y$, where $x \geq 0$, $y \geq 2$, and $x+y=6$. For example, the precursor gas can be $Si(CH_2)SiH_6$, as illustrated in FIG. 9, or $Si(CH_2)Si(CH_3)_4H_2$, as illustrated in FIG. 10.

Figure 11:
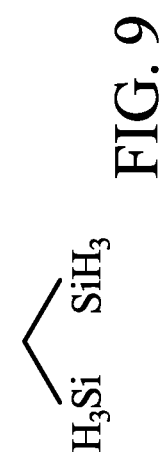
Figure 12:
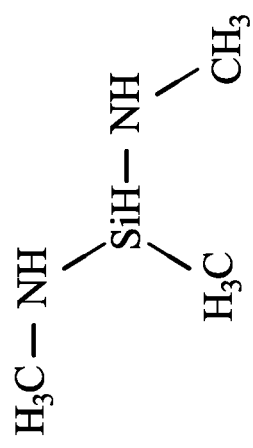

In some examples, a precursor gas includes silicon, an organic group, and a halogen, is nitrogen-free, and can have a general chemical formula of $Si(CH_2)_xSiR_yCl_z$, where R can be —H or —$CH_3$, $2 \geq x \geq 1$, $y \geq 0$, $z \geq 1$, and $y+z=2(4-x)$. For example, the precursor gas can be $Si(CH_2)Si(CH_3)_4Cl_2$, as illustrated in FIG. 11, or $Si(CH_2)_2SiCl_4$, as illustrated in FIG. 12.

Figure 13:
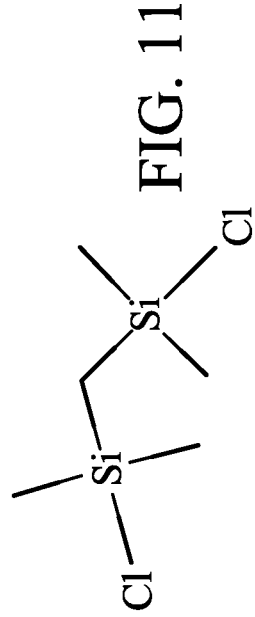
Figure 14:
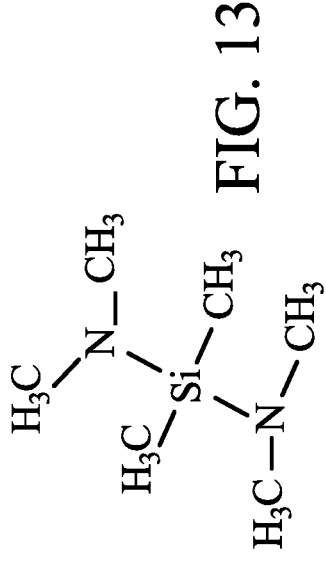

In some examples, a precursor gas includes silicon, an organic group, and nitrogen, is halogen-free, and can have a general chemical formula of $SiH_x(CH_3)_y(R)_z$, where R can be —$NH(CH_3)$ or —$N(CH_3)_2$, $x \geq 0$, $y \geq 1$, $z \geq 1$, and $x+y+z=4$. For example, the precursor gas can be $Si(CH_3)_2(N(CH_3)_2)_2$, as illustrated in FIG. 13, or $SiH(CH_3)(NH(CH_3))_2$, as illustrated in FIG. 14.

The reactant is a gas that can include nitrogen. In some examples, the reactant gas is or includes ammonia ($NH_3$), nitrogen ($N_2$), or a combination thereof. In some examples, the reactant gas can be or include a mixture of hydrogen ($H_2$) with at least one of ammonia ($NH_3$) or nitrogen ($N_2$). The precursor gas and/or the reactant gas may further be mixed with a carrier gas, such as argon (Ar), helium (He), or the like, during respective pulsing during the ALD process.

The ALD process may be implemented with a process temperature in a range from about 150° C. to about 650° C., such as from about 200° C. to about 500° C. or from about 500° C. to about 650° C. A pressure during the pulsing operations of the cycle of the ALD process may be in a range from about 30 Pascal (Pa) to about 1500 Pa. In some examples, the ALD process deposits the conformal dielectric material 24 at a rate in a range from about 0.3 Å/cycle to about 0.9 Å/cycle. The tool used to implement the ALD process can be a furnace reactor, a rotary reactor, a single wafer reactor, a batch wafer reactor, or the like.

As illustrated, in some examples, the conformal dielectric material 24 is deposited to a thickness that does not fill a narrow trench, e.g., a trench with the first width W1. In some examples, the conformal dielectric material 24 has a step coverage of equal to or greater than about 95% as deposited. As described in further detail subsequently, the conformal dielectric material 24 is to be converted to another dielectric material. In some examples, the conversion of the conformal dielectric material 24 causes the conformal dielectric material 24 to expand, and hence, the other dielectric material has an increased volume relative to the conformal dielectric material 24. By not filling the narrow trench with the conformal dielectric material 24, the increased volume of the converted dielectric material may be accommodated in the narrow trench. In some examples, the volume can increase up to about 10%, and in such examples, the thickness of the conformal dielectric material 24 can be in a range from about 45.45% to less than 50% of the width (e.g., the first width W1) of the narrow trench. In such examples, the conformal dielectric material 24 does not have lateral growth fronts 24a and 24b (e.g., that propagate from respective facing sidewalls of fins 22) that merge in the narrow trench. Further, because the lateral growth fronts 24a and 24b do not merge in the narrow trench, a species used for converting the conformal dielectric material 24 may reach the conformal dielectric material 24 at the bottom of the narrow trench more efficiently, which can facilitate the conversion.

The conformal dielectric material 24 can be or include silicon carbon nitride (SiCN) as deposited according to the precursors and reactants described above. Organic groups, such as —CH$_x$, can be formed in the silicon carbon nitride. The organic groups can cause terminals in the conformal dielectric material 24 that can prevent, e.g., crosslinking in the conformal dielectric material 24. The organic groups can create a porous structure in the conformal dielectric material 24 and/or create loose localized backbones of the conformal dielectric material 24. For example, the conformal dielectric material 24 can have a low-density, such as less than or equal to about 2.4 g/cm$^3$, as a result of the porous structure. The porous structure and/or loose localized backbones can permit efficient penetration of the conformal dielectric material 24 by a species used for converting the conformal dielectric material 24 to another dielectric material. In some examples, the ALD process used to deposit the conformal dielectric material 24 is an oxygen-free process, and hence, the conformal dielectric material 24 does not include oxygen.

Figure 3:
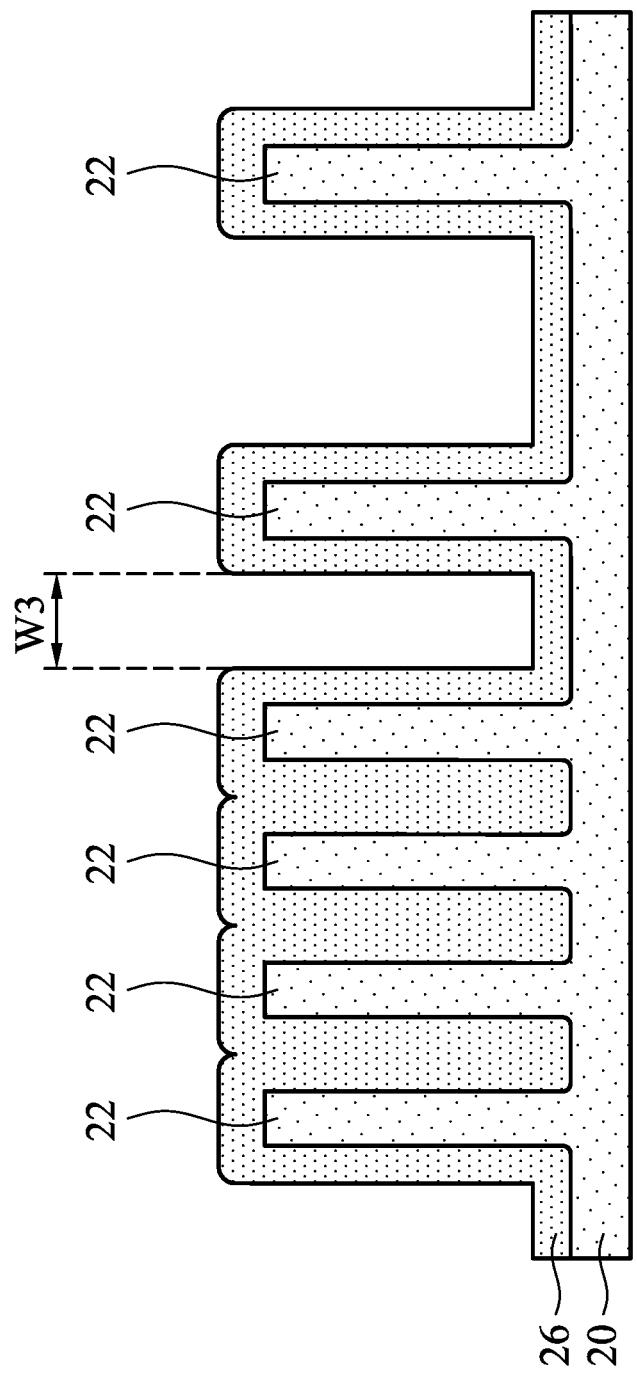

FIG. 3 illustrates the conversion of the conformal dielectric material 24 into a converted dielectric material 26. In some examples, the conformal dielectric material 24 is converted to an oxide by an oxidation process. In other examples, the conformal dielectric material 24 may be converted to another dielectric material using any appropriate process.

In some examples in which an oxidation process is performed, the oxidation process can include an anneal in an oxygen-containing ambient (e.g., steam), a gas soak in an oxygen-containing ambient, an oxygen-containing plasma, and/or an ultraviolet (UV) treatment in an oxygen-containing ambient. Various ones of the anneal, gas soak, plasma, and UV treatment may be combined. For example, a UV treatment may be performed simultaneously with or following a plasma.

An anneal in an oxygen-containing ambient can include flowing steam (H$_2$O), oxygen (O$_2$), ozone (O$_3$), the like, or a combination thereof into a chamber in which the semiconductor substrate 20 with the conformal dielectric material 24 is disposed. The anneal in the oxygen-containing ambient can be performed at a temperature equal to or greater than about 400° C., such as in a range from about 400° C. to about 650° C., and more particularly, from about 450° C. to about 550° C.

A gas soak in an oxygen-containing ambient and/or an oxygen-containing plasma can include flowing oxygen (O$_2$), ozone (O$_3$), the like, or a combination thereof into a chamber in which the semiconductor substrate 20 with the conformal dielectric material 24 is disposed. The gas soak and/or plasma process can be performed at a lower temperature than the anneal, such as at a temperature equal to or less than about 100° C., such as in a range from about 10° C. to about 80° C., and more particularly, from about 10° C. to about 60° C. In a plasma process, the plasma may be a remote plasma that generates an oxygen radical. The oxygen radical may have improved penetration in the conformal dielectric material 24 compared to oxygen in the absence of a plasma.

A UV treatment may include exposing the conformal dielectric material 24 to UV light, which can provide energy for reactions in the conformal dielectric material 24. The UV treatment may be performed in an oxygen-containing ambient, such as including oxygen (O$_2$), ozone (O$_3$), the like, or a combination thereof. The UV treatment may implement UV light with a wavelength spectrum from about 200 nm to about 700 nm, for example. The UV treatment may be performed at a temperature equal to or less than about 400° C., such as equal to or less than about 100° C.

Processing the conformal dielectric material 24 in an oxygen-containing ambient anneal, soak, plasma, and/or UV treatment permits an oxygen-containing species to penetrate the conformal dielectric material 24. The porous structure of the conformal dielectric material 24 may facilitate the penetration. Additionally, an oxygen radical from an oxygen-containing plasma may have better penetration. With the oxygen-containing species penetrating into the conformal dielectric material 24, the oxygen-containing species can react with the material of the conformal dielectric material 24 to convert the conformal dielectric material 24 into the converted dielectric material 26, which may be an oxide in these examples. The loose localized backbones and structure of the conformal dielectric material 24 caused by the organic groups can permit the oxygen-containing species to react with the material of the conformal dielectric material 24, which can oxidize the material and can create one or more byproducts. The byproducts can include nitrogen, carbon, and/or hydrogen. The byproducts can diffuse through the conformal dielectric material 24 and be outgassed.

The volume of the converted dielectric material 26 may be greater than the volume of the conformal dielectric material 24, such as by up to about 10%. The oxidation of the conformal dielectric material 24 can cause the volume of the converted dielectric material 26 to be expanded relative to the conformal dielectric material 24. With the expansion in volume, lateral growth fronts (e.g., lateral growth fronts 24a and 24b of the conformal dielectric material 24) can merge during the conversion to the converted dielectric material 26. Hence, in narrow trenches, seams and/or voids can be avoided. Further, the expansion in volume can cause the converted dielectric material 26 to be less dense than the conformal dielectric material 24. Further, the lower density and increased volume caused by oxidation and transformation from a nitrogen-rich to an oxygen-rich dielectric corresponds to a reduction of k-value, that is, a k-value of the converted dielectric material 26 is less than the conformal dielectric material 24.

Processing conditions, such as a flow rate of an oxygen-containing gas, pressure, temperature, and/or duration of exposure to the oxygen-containing ambient, can affect the extent to which the conformal dielectric material 24 is oxidized and/or byproducts are outgassed. Hence, the processing conditions may be tuned to achieve a target material with various characteristics. For example, a composition of the converted dielectric material 26 may be desired to have a k-value and/or etch selectivity. Some example compositions are described further below. Further, a UV treatment may be performed, such as in processes with low thermal budgets, to enhance reactions with the oxygen-containing species and to provide for further crosslinking in the converted dielectric material 26, which can increase the strength and structural integrity of the converted dielectric material 26.

In some examples, the converted dielectric material 26 is a silicon oxide (SiO$_x$), silicon oxycarbide (SiO$_x$C$_y$), silicon oxycarbide nitride (SiO$_x$C$_y$N$_z$), or the like. In some examples, the converted dielectric material 26 is a silicon oxide (SiO$_x$) with an atomic ratio of oxygen to silicon (O:Si) in a range from about 2.2 to about 1.8. In some examples, the converted dielectric material 26 is silicon oxycarbide (SiO$_x$C$_y$) or silicon oxycarbide nitride (SiO$_x$C$_y$N$_z$) with an atomic ratio of oxygen to silicon (O:Si) equal to or greater than about 2.0, carbon at a concentration in a range from about 5 atomic percent (at. %) to about 16 at. %, and, possibly, nitrogen at a concentration less than or equal to about 5 at. %. The silicon oxycarbide ($SiO_xC_y$) or silicon oxycarbide nitride ($SiO_xC_yN_z$) can have a wet etch rate in diluted hydrofluoric acid (dHF) in a range from about 0.6 to about 1 times the wet etch rate of silicon dioxide ($SiO_2$). In some examples, the converted dielectric material 26 is silicon oxycarbide nitride ($SiO_xC_yN_z$) with an atomic ratio of oxygen to silicon (O:Si) in a range from about 1.6 to about 1.1, carbon at a concentration in a range from about 3 at. % to about 10 at. %, and nitrogen at a concentration in a range from about 5 at. % to about 15 at. %. The silicon oxycarbide nitride ($SiO_xC_yN_z$) can have a wet etch rate in dHF less than or equal to about 0.5 times the wet etch rate of silicon dioxide ($SiO_2$). In some examples, the k-value of the converted dielectric material 26 is in a range from about 3.4 to about 3.9. Varying the concentration of carbon in the converted dielectric material 26 can vary the k-value, such as increasing the concentration of carbon can result in a lower k-value, and decreasing the concentration of carbon can result in a higher k-value.

As illustrated, in some examples, some trenches may not be filled by the converted dielectric material 26. For example, with some configurations of fins 22, some trenches may be wider than the narrow trenches that are filled, such as wider by about 10 nm or more. Hence, in some examples, a width W3 of a trench between opposing sidewalls of the converted dielectric material 26 may be about 10 nm or more. Hence, in such examples, a filling process may be performed to fill the wider trenches with a fill dielectric material 28. In other examples, where such wider trenches are not present, the filling process can be omitted.

Figure 4:
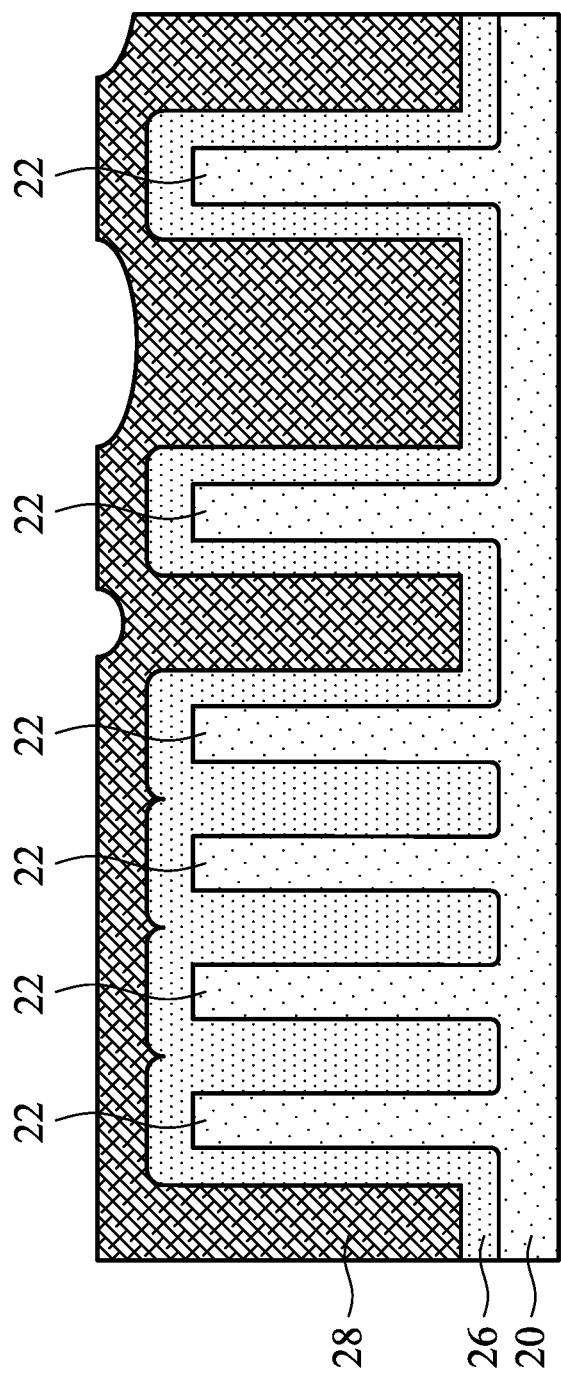

FIG. 4 illustrates depositing a fill dielectric material 18 on the converted dielectric material 26 to fill trenches that were not previously filled by the converted dielectric material 26. In some examples, filling the trenches includes using a flowable deposition process, such as a flowable chemical vapor deposition (FCVD) process. The flowable deposition process can include a silicon-containing organic precursor gas, a nitrogen-containing precursor gas, and an oxygen-containing precursor gas. The silicon-containing organic precursor gas can be or include polysilazanes, silylamine (such as trisilylamine (TSA) or disilylamine (DSA)), tetramethyloxysilane (TMOS), octamethylcyclotetrasiloxane (OMCTS), the like, or a combination thereof. The nitrogen-containing precursor gas can be or include ammonia ($NH_3$), nitrogen ($N_2$), the like, or a combination thereof. The oxygen-containing precursor gas can be oxygen ($O_2$), or the like. The nitrogen-containing precursor gas and oxygen-containing precursor gas can be activated by a plasma in a remote plasma and carried to the deposition chamber. The activated nitrogen-containing and oxygen-containing precursor gases can react with the silicon-containing organic precursor gas to form a byproduct that flows into the trenches. The byproduct can form a material including silicon and nitrogen. In some examples, the byproduct may not be able to flow into narrow gaps, such as gaps with a width of less than 10 nm, and more particularly, less than 6 nm, without a void being formed. For example, the size of the compounds and/or molecules formed as the byproduct may be too large to flow into gaps with small widths and/or forces, such as surface tension, may prohibit the byproducts from flowing into gaps with small widths. Hence, voids can be formed in gaps or trenches with small widths using a flowable deposition process, such as a FCVD.

The material flowed into the trenches can then be converted, such as by an oxidation process. The oxidation process can include an anneal in an oxygen-containing ambient (e.g., steam), a gas soak in an oxygen-containing ambient, an oxygen-containing plasma, and/or a UV treatment in an oxygen-containing ambient, as described above. The conversion process can convert the material into the fill dielectric material 28, which can be or include a silicon oxide ($SiO_x$).

In some examples where a fill dielectric material 28 is to be formed, the conversion of the conformal dielectric material 24 to the converted dielectric material 26 may be performed simultaneously with the conversion to the fill dielectric material 28. Hence, in such examples, a conversion process may be omitted.

In some examples, the fill dielectric material 28 is a silicon oxide ($SiO_x$) with an atomic ratio of oxygen to silicon (O:Si) in a range from about 1.5 to about 2.0. In some examples, the fill dielectric material 28 is silicon oxycarbide nitride ($SiO_xC_yN_z$) with an atomic ratio of oxygen to silicon (O:Si) in a range from about 1.3 to about 1.9, carbon at a concentration in a range from about 0 at. % to about 20 at. %, and nitrogen at a concentration in a range from about 0 at. % to about 2 at. %. The silicon oxycarbide nitride ($SiO_xC_yN_z$) can have a wet etch rate in dHF in a range from about 1 to about 2 times the wet etch rate of silicon dioxide ($SiO_2$). In some examples, the k-value of the fill dielectric material 28 is in a range from about 3.9 to about 4.4.

Figure 5A:
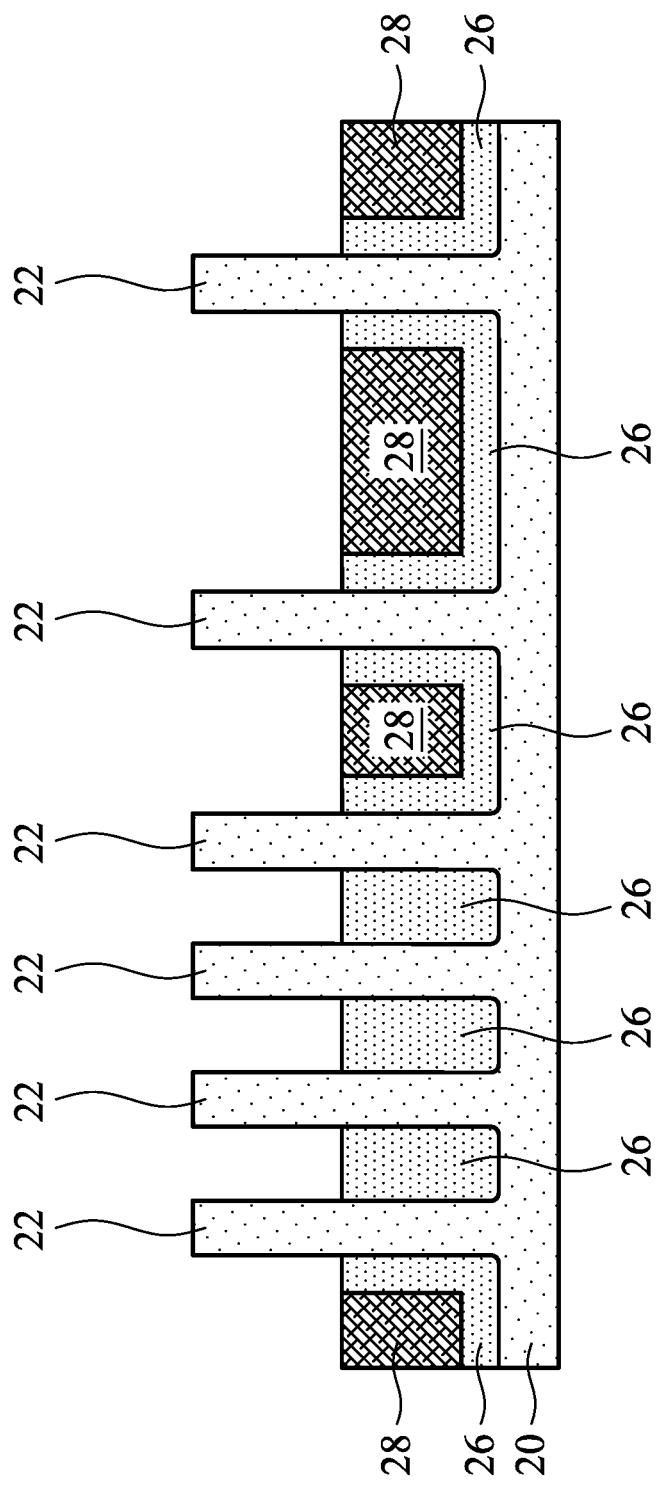
Figure 5B:
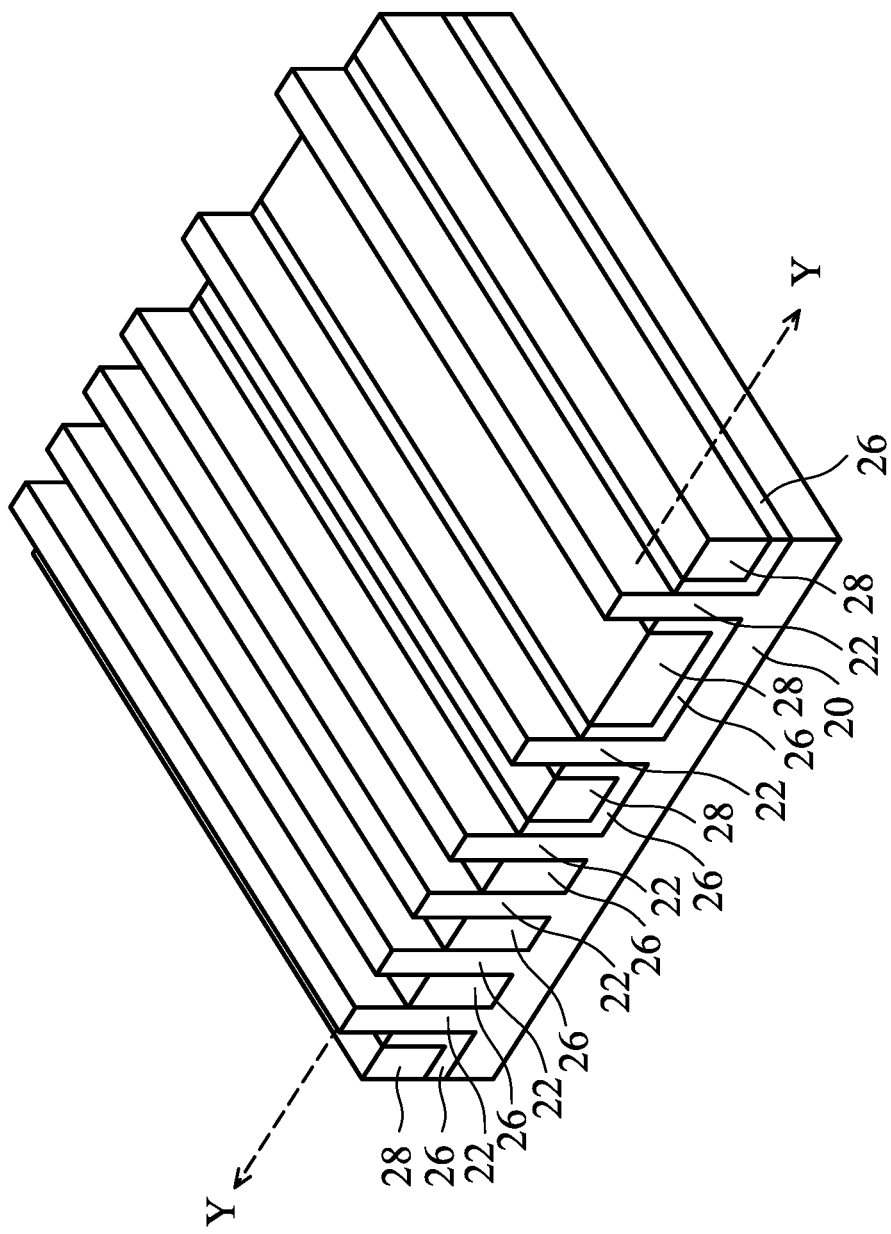

FIGS. 5A and 5B illustrate recessing of the converted dielectric material 26 and the fill dielectric material 28 to form isolation regions between the fins 22. The fill dielectric material 28 and converted dielectric material 26 are planarized, such as by a chemical mechanical planarization (CMP), to the top surfaces of the fins 22, and after being planarized, are recessed (e.g., by etching) such that the fins 22 protrude from between the remaining fill dielectric material 28 and converted dielectric material 26, which forms the isolation regions. The recessing can be performed using an appropriate etch process, which can be a wet or dry etch process. In some examples, the etch process is a wet etch process using an etchant comprising hydrofluoric acid (HF), such as diluted HF (dHF). In the dHF, the hydrofluoric acid (HF) may be diluted in deionized water (DIW) at a ratio in a range from about 1:60 (HF:DIW) to about 1:500 (HF:DIW), such as about 1:100 (HF:DIW).

FIG. 5B illustrates a perspective view of the isolation regions formed between the fins 22 and on the semiconductor substrate 20. This structure in FIG. 5B may be a basis for forming FinFETs, an example of which is described subsequently.

Figure 6:
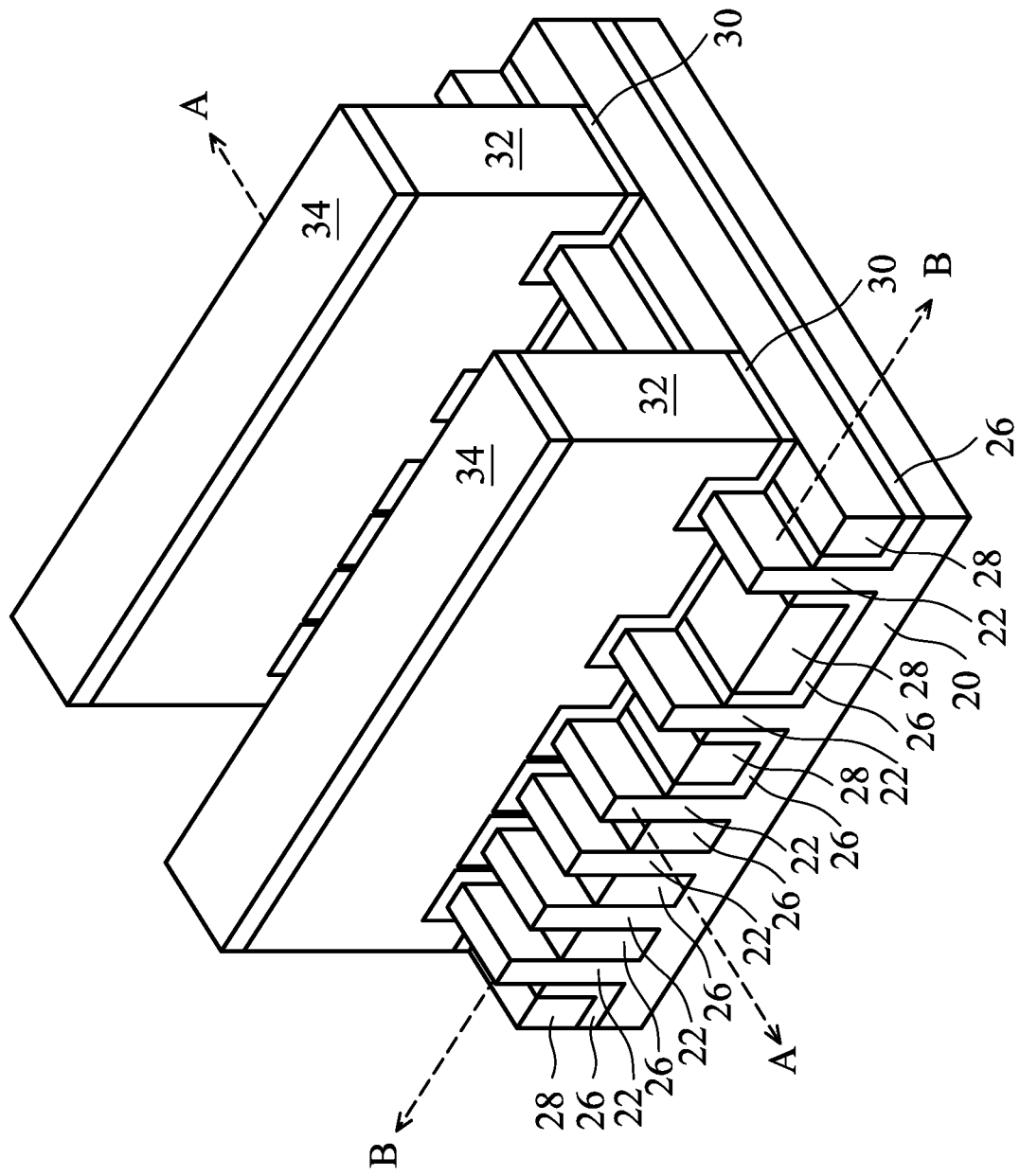

FIG. 6 illustrates a perspective view of the dummy gate stacks (or more generally, gate structures) formed across the fins 22 and isolation regions. The dummy gate stacks are formed on the fins 22 for a replacement gate process, as described herein. The dummy gate stacks extend longitudinally perpendicularly to respective longitudinal directions of the fins 22. Each dummy gate stack includes an interfacial dielectric 30 along and on the fins 22, a dummy gate 32 over the interfacial dielectric 30, and a mask 34 over the dummy gate 32.

The interfacial dielectrics 30 may include or be silicon oxide, silicon nitride, the like, or multilayers thereof. The dummy gates 32 may include or be silicon (e.g., polysilicon) or another material. The masks 34 may include or be silicon nitride, silicon oxynitride, silicon carbon nitride, the like, or a combination thereof. Layers for the interfacial dielectrics 30, dummy gates 32, and masks 34 for the dummy gate stacks may be sequentially deposited or formed, such as by any acceptable deposition technique, and then patterned, for example, using photolithography and one or more etch processes, into the dummy gate stacks.

Figure 7A:
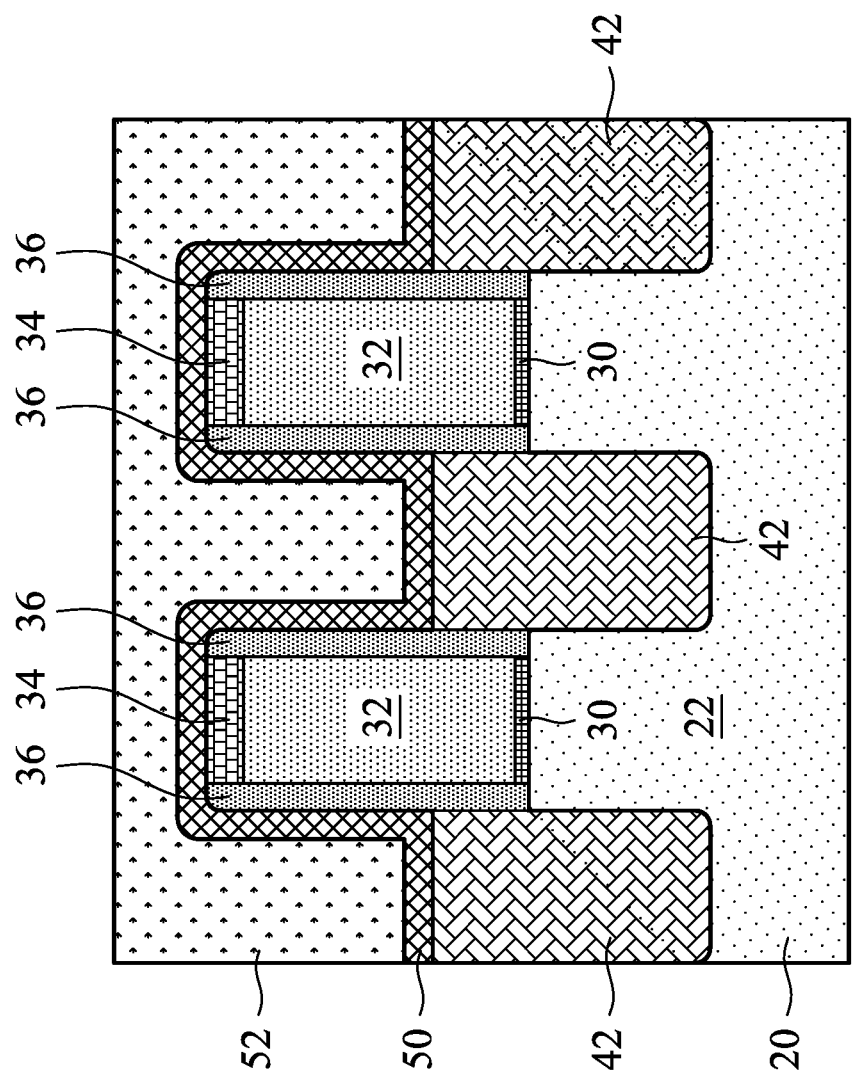
Figure 7B:
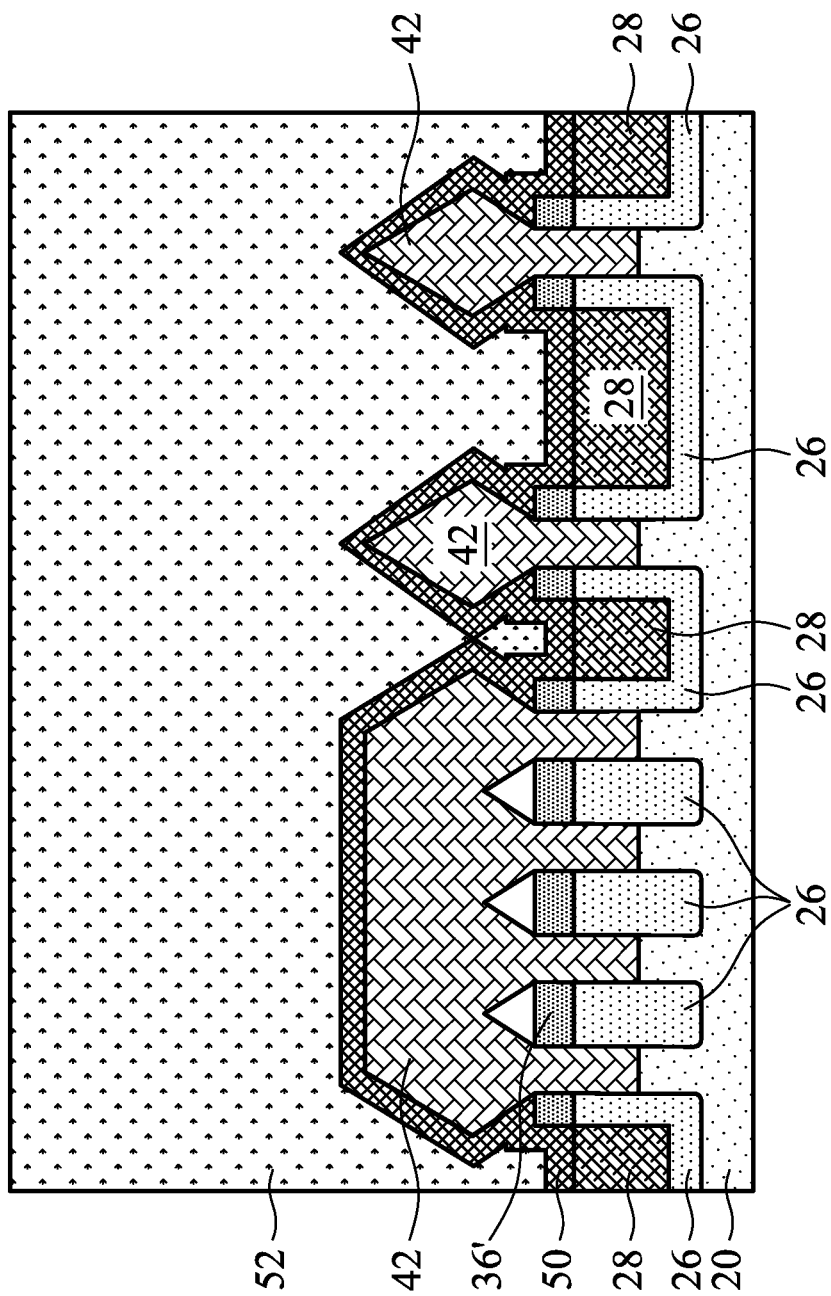
Figure 8A:
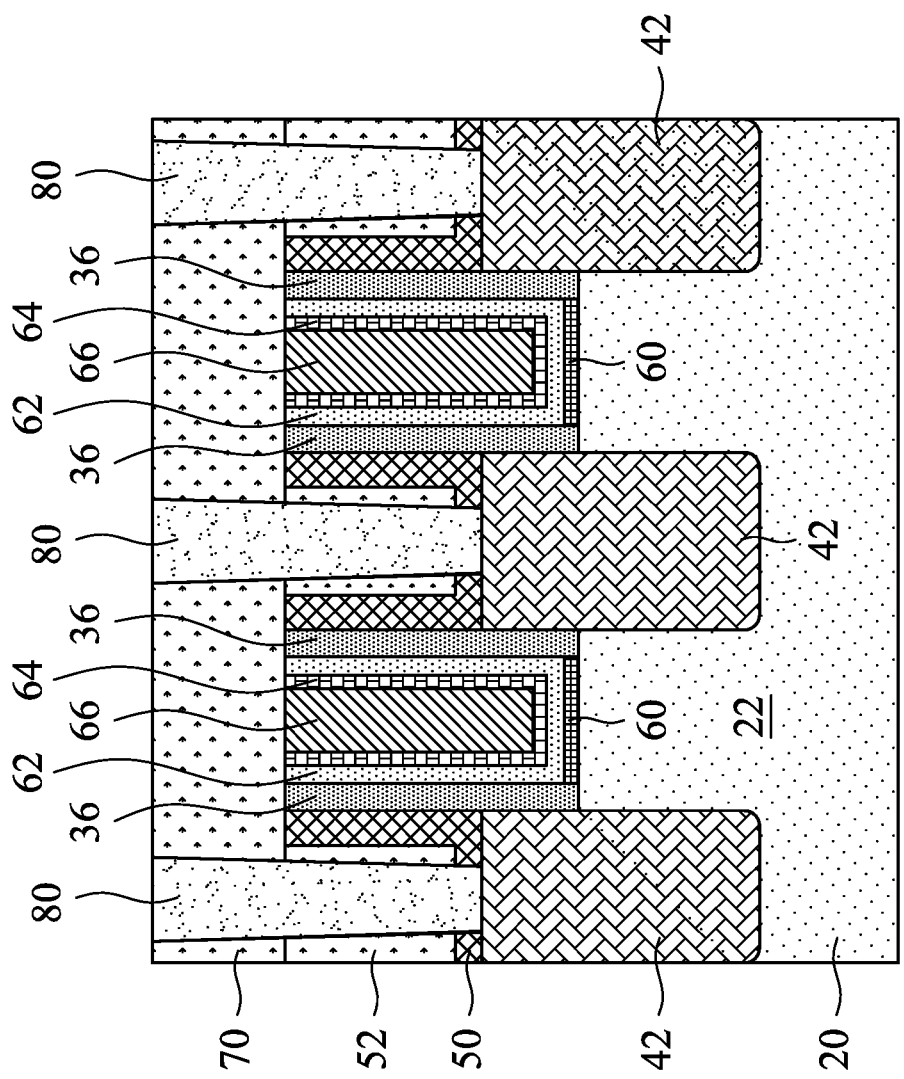
Figure 8B:
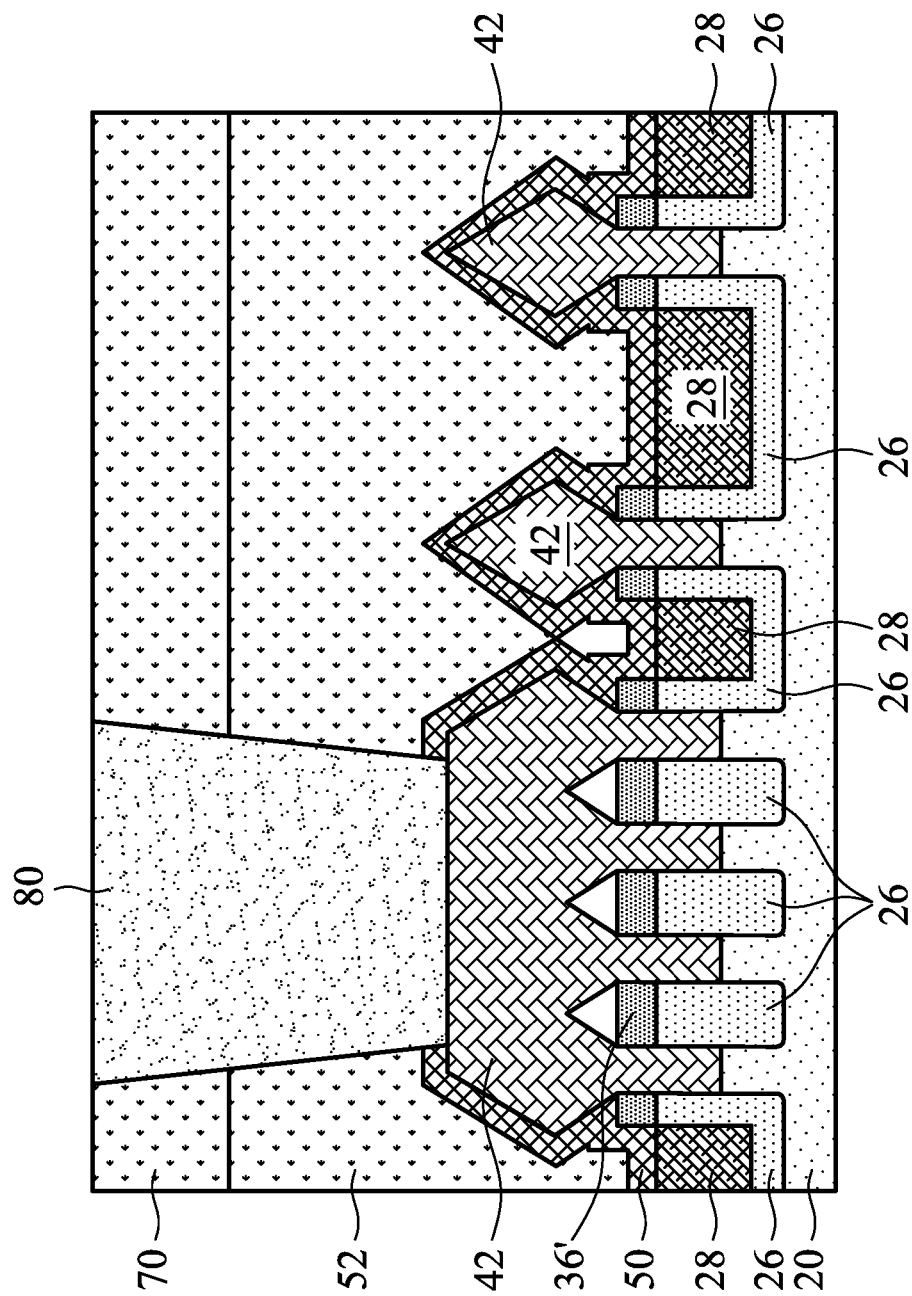

FIG. 6 further illustrates reference cross-sections that are used in later figures. Cross-section A-A is in a plane that will be along, e.g., channels in one fin 22 between opposing source/drain regions. Cross-section B-B is in a plane perpendicular to cross-section A-A and is across source/drain regions in different respective fins 22. FIGS. 7A and 8A illustrate cross-sectional views at various instances of processing corresponding to cross-section A-A, and FIGS. 7B and 8B illustrate cross-sectional views at various instances of processing corresponding to cross-section B-B. Further processing is described with reference to FIGS. 7A-7B and 8A-8B.

Referring to FIGS. 7A and 7B, gate spacers 36 are formed along sidewalls of the dummy gate stacks and over the fins 22. Residual gate spacers 36' (or fin spacers) may also be formed along sidewalls of the fins 22, for example, depending on the height of the fins 22 above the isolation regions, as a result of the formation of the gate spacers 36. The gate spacers 36 may be formed by conformally depositing one or more layers for the gate spacers 36 and anisotropically etching the one or more layers, for example, by appropriate processes. The one or more layers for the gate spacers 36 may include or be silicon oxygen carbide, silicon nitride, silicon oxynitride, silicon carbon nitride, the like, multi-layers thereof, or a combination thereof.

Recesses are then formed in the fins 22 on opposing sides of the dummy gate stacks. The recessing can be by an etch process. The etch process can be isotropic or anisotropic, or further, may be selective with respect to one or more crystalline planes of the semiconductor substrate 20. Hence, the recesses can have various cross-sectional profiles based on the etch process implemented.

Epitaxial source/drain regions 42 are formed in the recesses. The epitaxial source/drain regions 42 may include or be silicon germanium, germanium, silicon carbide, silicon phosphorus, silicon carbon phosphorus, a III-V compound semiconductor, a II-VI compound semiconductor, or the like. The epitaxial source/drain regions 42 may be formed in the recesses by epitaxial growth with appropriate deposition processes. In some examples, epitaxial source/drain regions 42 may be formed with facets (which may correspond to crystalline planes of the semiconductor substrate 20), such as shown in FIG. 7B, and may be formed at a raised height with respect to the respective fin 22, such as shown in FIG. 7A. In some examples, epitaxial source/drain regions 42 in some fins 22 can be epitaxially grown to merge together, while other fins 22 can have respective epitaxial source/drain regions 42 that do not merge with another epitaxial source/drain region, such as due to proximity to neighboring fins 22. FIG. 7B illustrates an example where some epitaxial source/drain regions 42 merge to form a merged epitaxial source/drain region 42, while other epitaxial source/drain regions 42 do not merge. Other examples can include any combination of un-merged and merged epitaxial source/drain regions 42.

In some examples, the epitaxial source/drain regions 42 may also be doped, such as by in situ doping during epitaxial growth and/or by implanting dopants into the epitaxial source/drain regions 42 after epitaxial growth. Hence, a source/drain region may be delineated by doping (e.g., by in situ doping during epitaxial growth) and/or by epitaxial growth, which may further delineate the active area in which the source/drain region is delineated.

A contact etch stop layer (CESL) 50 is conformally deposited on surfaces of the epitaxial source/drain regions 42, sidewalls and top surfaces of the gate spacers 36, top surfaces of the masks 34, and top surfaces of the isolation regions. Generally, an etch stop layer (ESL) can provide a mechanism to stop an etch process when forming, e.g., contacts or vias by having a different etch selectivity from adjacent layers or components. The CESL 50 may comprise or be silicon nitride, silicon carbon nitride, carbon nitride, the like, or a combination thereof, and may be deposited by any appropriate conformal deposition process.

A first interlayer dielectric (ILD) 52 is formed over the CESL 50. The first ILD 52 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 52 may be deposited by any acceptable deposition process.

Referring to FIGS. 8A and 8B, dummy gate stacks are replaced with replacement gate structures. The first ILD 52 and CESL 50 are formed with top surfaces coplanar with top surfaces of the dummy gates 32, such as by a planarization process, such as a CMP. The CMP may also remove the masks 34 (and, in some instances, upper portions of the gate spacers 36) on the dummy gates 32. Accordingly, top surfaces of the dummy gates 32 are exposed through the first ILD 52 and the CESL 50. With the dummy gates 32 exposed through the first ILD 52 and the CESL 50, the dummy gates 32 are removed, such as by one or more acceptable etch processes. Recesses are formed between gate spacers 36 where the dummy gate stacks are removed, and channel regions of the fins 22 are exposed through the recesses.

The replacement gate structures are formed in the recesses where the dummy gate stacks were removed. The replacement gate structures each include, as illustrated, an interfacial dielectric 60, a gate dielectric layer 62, one or more optional conformal layers 64, and a gate conductive fill material 66. The interfacial dielectric 60, a gate dielectric layer 62, one or more optional conformal layers 64, and a gate conductive fill material 66 can be deposited by any appropriate deposition technique. The interfacial dielectric 60 is formed on sidewalls and top surfaces of the fins 22 along the channel regions. The interfacial dielectric 60 can be, for example, the interfacial dielectric 30 if not removed, an oxide (e.g., silicon oxide), a nitride (e.g., silicon nitride), and/or another dielectric layer.

The gate dielectric layer 62 can be conformally deposited in the recesses where dummy gate stacks were removed (e.g., on top surfaces of the isolation regions, on the interfacial dielectric 60, and sidewalls of the gate spacers 36) and on the top surfaces of the first ILD 52, the CESL 50, and gate spacers 36. The gate dielectric layer 62 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), or a combination thereof.

Then, the one or more optional conformal layers 64 can be conformally (and sequentially, if more than one) deposited on the gate dielectric layer 62. The one or more optional conformal layers 64 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 66 is formed over the one or more optional conformal layers 64, if implemented, and/or the gate dielectric layer 62. The gate conductive fill material 66 can fill remaining recesses where the dummy gate stacks were removed. The gate conductive fill material 66 may be or comprise a metal-containing material such as tungsten, cobalt, aluminum, ruthenium, copper, multi-layers thereof, a combination thereof, or the like. A planarization process, such as a CMP, may remove excess gate conductive fill material 66, one or more optional conformal layers 64, and gate dielectric layer 62. The replacement gate structures comprising the gate conductive fill material 66, one or more optional conformal layers 64, gate dielectric layer 62, and interfacial dielectric 60 may therefore be formed as illustrated in FIG. 8A.

A second ILD 70 is formed over the first ILD 52, CESL 50, gate spacers 36, and replacement gate structures. The second ILD 70 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 70 may be deposited by any appropriate deposition process.

Respective openings are formed through the second ILD 70, the first ILD 52, and the CESL 50 to expose at least a portion of respective epitaxial source/drain regions 42. The second ILD 70, the first ILD 52, and the CESL 50 may be patterned with the openings, for example, using photolithography and one or more etch processes.

After the formation of the source/drain contact openings, conductive features are formed in the openings to the epitaxial source/drain regions 42. The conductive features 80 may include a silicide region formed on the epitaxial source/drain regions 42, an adhesion and/or barrier layer, and a conductive fill material on the adhesion and/or barrier layer. The silicide region may be formed by thermally reacting an upper portion of the epitaxial source/drain regions 42 with a metal layer (not shown), such as titanium, tantalum, or the like, formed on the epitaxial source/drain regions 42. The adhesion and/or barrier layer is conformally deposited in the openings. The adhesion and/or barrier layer may be or include titanium nitride, titanium oxide, tantalum nitride, tantalum oxide, any suitable transition metal nitrides or oxides, the like, or any combination thereof, and may be deposited by any suitable deposition technique. The conductive fill material may be or include cobalt, tungsten, copper, ruthenium, aluminum, gold, silver, alloys thereof, the like, or a combination thereof, and may be deposited by any suitable deposition technique. After the conductive material is deposited, excess conductive fill material and adhesion and/or barrier layer may be removed by using a planarization process, such as a CMP. The conductive features 80 may be referred to as contacts, plugs, etc.

Figures 15, 16:
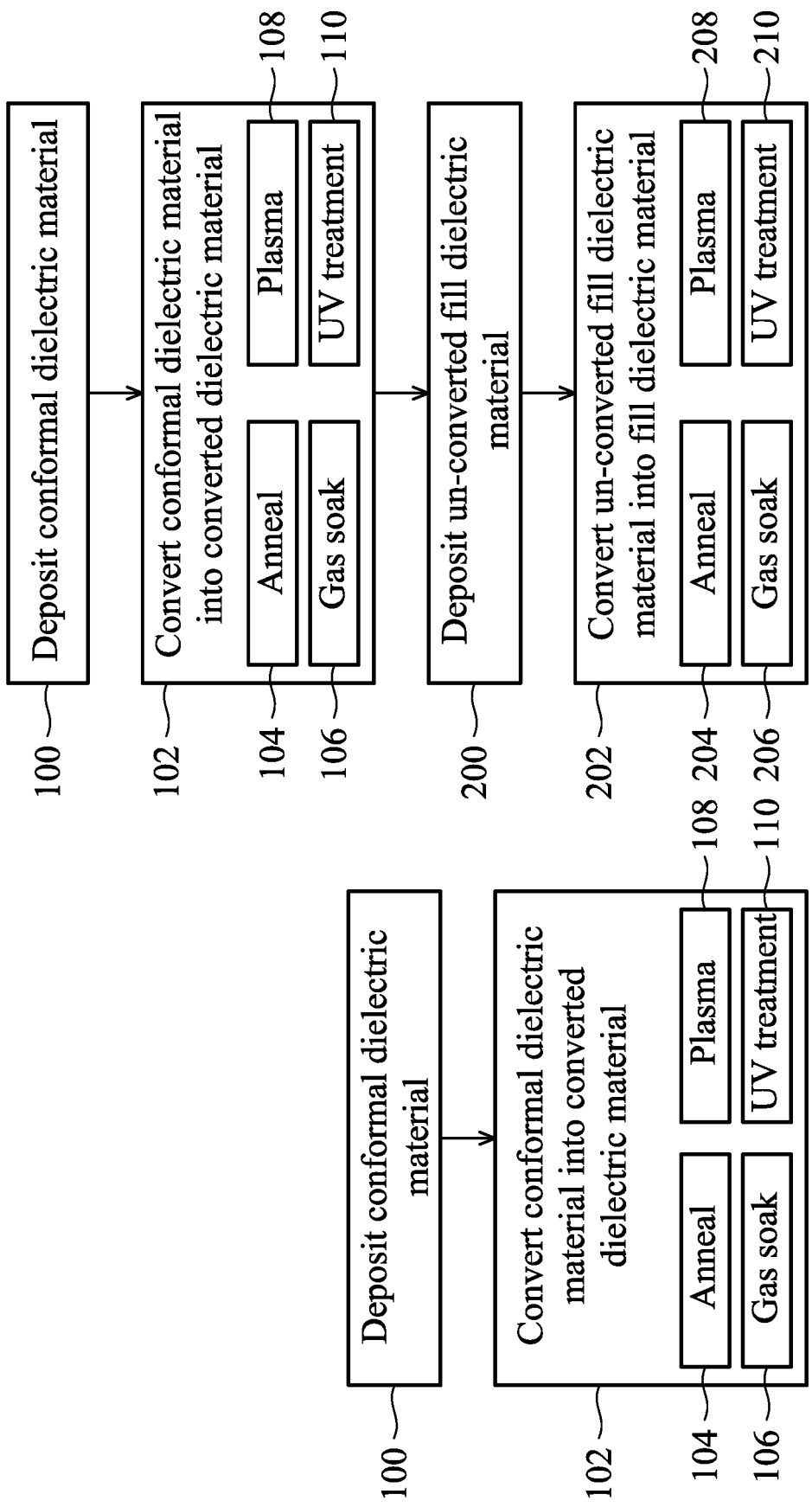
FIG. 15 is a flowchart of a method for filling one or more trenches in accordance with some embodiments.
FIG. 16 is a flowchart of a method for filling one or more trenches in accordance with some embodiments.

FIG. 15 is a flowchart of a method for filling one or more trenches in accordance with some embodiments. The method of FIG. 15 may fill, for example, narrow trenches on a substrate, where large width trenches are not present on the substrate. In block 100, a conformal dielectric material is deposited, like the conformal dielectric material 24 described above with respect to FIG. 2. In block 102, the conformal dielectric material is converted to a converted dielectric material, such as the conformal dielectric material 24 is converted to the converted dielectric material 26 as described above with respect to FIG. 3. The conversion in block 102 can include any one or more of an anneal in an oxygen-containing ambient in block 104, a gas soak in an oxygen-containing ambient in block 106, an oxygen-containing plasma in block 108, and/or a UV treatment in an oxygen-containing ambient in block 110. The conversion in block 102 can include any one or combination of two or more of the anneal in block 104, gas soak in block 106, plasma process in block 108, and UV treatment in block 110. In an example, the UV treatment in block 110 is performed following or simultaneously with the plasma process in block 108.

FIG. 16 is a flowchart of a method for filling one or more trenches in accordance with some embodiments. The method of FIG. 16 may fill, for example, narrow trenches and large width trenches on a substrate. In block 100, a conformal dielectric material is deposited, as described above with reference to FIG. 15. In block 102, the conformal dielectric material is converted to a converted dielectric material, as described above with reference to FIG. 15. In block 200, an un-converted fill dielectric material is deposited, such as described above with respect to FIG. 4. In block 202, the un-converted fill dielectric material is converted to a fill dielectric material, such as described above with respect to the fill dielectric material 28 in FIG. 4. The conversion in block 202 can include any one or more of an anneal in an oxygen-containing ambient in block 204, a gas soak in an oxygen-containing ambient in block 206, an oxygen-containing plasma in block 208, and/or a UV treatment in an oxygen-containing ambient in block 210. The conversion in block 202 can include any one or combination of two or more of the anneal in block 204, gas soak in block 206, plasma process in block 208, and UV treatment in block 210. In an example, the UV treatment in block 210 is performed following or simultaneously with the plasma process in block 208. Blocks 204, 206, 208, and 210 may be the same as or similar to blocks 104, 106, 108, and 110, respectively.

Figure 17:
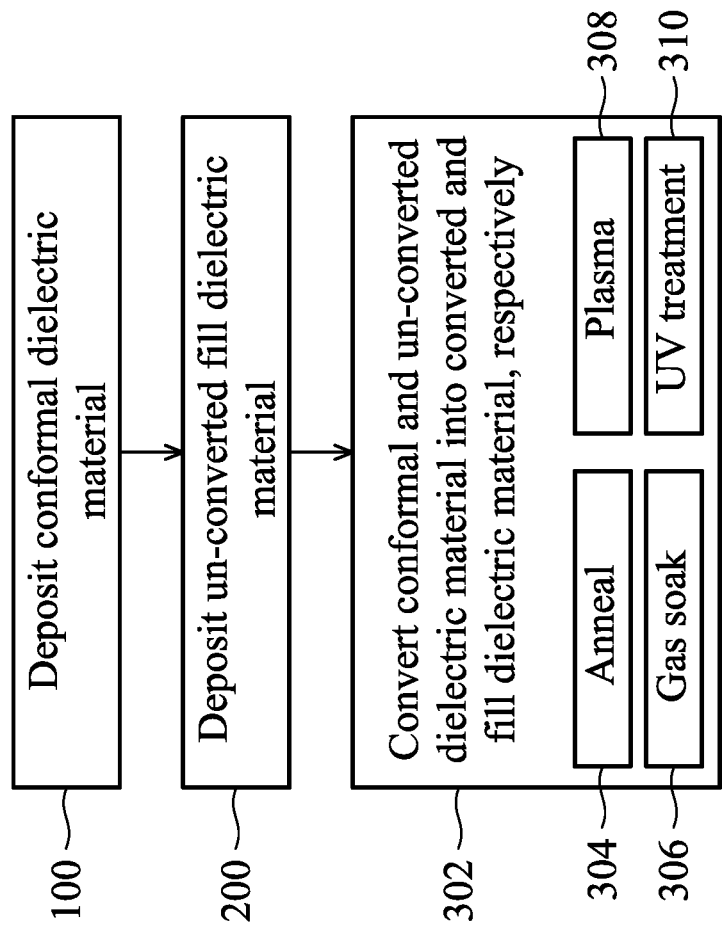
FIG. 17 is a flowchart of a method for filling one or more trenches in accordance with some embodiments.

FIG. 17 is a flowchart of a method for filling one or more trenches in accordance with some embodiments. The method of FIG. 17 may fill, for example, narrow trenches and large width trenches on a substrate. In block 100, a conformal dielectric material is deposited, as described above with reference to FIG. 15. In block 200, an un-converted fill dielectric material is deposited, such as described above with reference to FIG. 16. In this example, no conversion process is performed to convert the conformal dielectric material before the un-converted fill dielectric material is deposited. In block 302, the conformal dielectric material and the un-converted fill dielectric material are converted to a converted dielectric material (e.g., converted dielectric material 26) and a fill dielectric material (e.g., fill dielectric material 28), respectively. The conversion in block 302 can include any one or more of an anneal in an oxygen-containing ambient in block 304, a gas soak in an oxygen-containing ambient in block 306, an oxygen-containing plasma in block 308, and/or a UV treatment in an oxygen-containing ambient in block 310. The conversion in block 302 can include any one or combination of two or more of the anneal in block 304, gas soak in block 306, plasma process in block 308, and UV treatment in block 210.

In an example, the UV treatment in block 310 is performed following or simultaneously with the plasma process in block 308. Blocks 304, 306, 308, and 310 may be the same as or similar to blocks 104, 106, 108, and 110, respectively.

Some embodiments can achieve advantages. As described above, narrow gaps (e.g., trenches), such as with a width equal to or less than 10 nm (e.g., equal to or less than 6 nm), can be filled with a dielectric material without a seam or void being formed in the dielectric material. Further, when filling trenches with fins therebetween, bending of the fins can be reduced or obviated. Also, in structures with narrow gaps and larger gaps, the narrow gaps can be filled using an ALD process, and a flowable deposition process may subsequently be used to fill the larger gaps. This can allow for more efficient filling of the gaps and with improved quality. The dielectric material formed by these processes can be more robust to etch and cleaning processes, such as used to recess dielectric material for isolation regions.

An embodiment is a method of semiconductor processing. A first dielectric material is conformally deposited in a trench using an atomic layer deposition (ALD) process. After conformally depositing the first dielectric material, the first dielectric material is converted to a second dielectric material.

Another embodiment is a structure. A substrate has a first fin and a second fin, and a first sidewall of the first fin faces a second sidewall of the second fin. A width is from the first sidewall of the first fin to the second sidewall of the second fin. The width is less than 10 nm. A dielectric isolation is disposed between the first sidewall of the first fin and the second sidewall of the second fin. A top surface of the dielectric isolation is below a top of the first sidewall or the second sidewall. The dielectric isolation extends from the first sidewall of the first fin to the second sidewall of the second fin without a void therein. A gate structure is disposed over the dielectric isolation and along and over the first sidewall of the first fin and the second sidewall of the second fin.

A further embodiment is a method for semiconductor processing. A first dielectric material is conformally deposited in a first trench and a second trench in a substrate. The first trench is defined between a first fin and a second fin. The second trench is defined between a third fin and a fourth fin. The second trench is wider than the first trench. After conformally depositing the first dielectric material, a second dielectric material is flowed in to the second trench. The first dielectric material is converted to a third dielectric material, and the second dielectric material is converted to a fourth dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a substrate having a first fin, a second fin, a third fin, and a fourth fin, a first sidewall of the first fin facing a second sidewall of the second fin, a width being from the first sidewall of the first fin to the second sidewall of the second fin, the width being less than 10 nm;
    a dielectric isolation disposed between the first sidewall of the first fin and the second sidewall of the second fin, a top surface of the dielectric isolation being below a top of the first sidewall or the second sidewall, the dielectric isolation extending from the first sidewall of the first fin to the second sidewall of the second fin without a void therein, wherein the dielectric isolation extends between the third fin and the fourth fin, wherein the dielectric isolation between the first fin and the second fin comprises a first dielectric layer, wherein the dielectric isolation between the third fin and the fourth fin comprises the first dielectric layer and a second dielectric layer, wherein the dielectric isolation between the first fin and the second fin is free of the second dielectric layer; and
    a gate structure disposed over the dielectric isolation and along and over the first sidewall of the first fin and the second sidewall of the second fin.

2. The structure of claim 1, wherein:
    the first dielectric layer is silicon oxycarbide (SiOxCy) or silicon oxycarbide nitride (SiOxCyNz);
    an atomic ratio of oxygen to silicon (O:Si) in the first dielectric layer is equal to or greater than about 2.0;
    a concentration of carbon in the first dielectric layer is in a range from 5 atomic percent to 16 atomic percent; and
    a concentration of nitrogen in the first dielectric layer is less than or equal to 5 atomic percent.

3. The structure of claim 1, wherein:
    the first dielectric layer is silicon oxycarbide nitride (SiOxCyNz);
    an atomic ratio of oxygen to silicon (O:Si) in the first dielectric layer is in a range from 1.6 to 1.1;
    a concentration of carbon in the first dielectric layer is in a range from 3 atomic percent to 10 atomic percent; and
    a concentration of nitrogen in the first dielectric layer is in a range from about 5 atomic percent to about 15 atomic percent.

4. The structure of claim 1, wherein the first dielectric layer has a dielectric value in a range from 3.4 to 3.9.

5. The structure of claim 1, wherein the first dielectric layer and the second dielectric layer are recessed below an upper surface of the third fin.

6. The structure of claim 1, wherein the second dielectric layer comprises silicon oxide or silicon oxycarbide nitride.

7. A method of forming a semiconductor device, the method comprising:
    forming a first fin and a second fin protruding from a substrate, a first sidewall of the first fin facing a second sidewall of the second fin, a width being from the first sidewall of the first fin to the second sidewall of the second fin, the width being less than 10 nm;
    forming a dielectric isolation disposed between the first sidewall of the first fin and the second sidewall of the second fin, a top surface of the dielectric isolation being below a top of the first sidewall or the second sidewall, the dielectric isolation extending from the first sidewall of the first fin to the second sidewall of the second fin without a void therein, wherein the dielectric isolation is silicon oxycarbide (SiOxCy) or silicon oxycarbide nitride (SiOxCyNz) with an atomic ratio of oxygen to silicon (O:Si) in the dielectric isolation is equal to or greater than about 2.0 and with a concentration of carbon in the dielectric isolation is in a range from 5 atomic percent to 16 atomic percent; and forming a gate structure disposed over the dielectric isolation and along and over the first sidewall of the first fin and the second sidewall of the second fin.

8. The method of claim 7, wherein forming the dielectric isolation comprises:
conformally depositing a first dielectric material in a first trench between the first fin and the second fin using an atomic layer deposition (ALD) process; and
after conformally depositing the first dielectric material, converting the first dielectric material to a second dielectric material.

9. The method of claim 8, wherein after converting the first dielectric material to the second dielectric material, the first trench is completely filled.

10. The method of claim 8, wherein converting the first dielectric material to the second dielectric material causes the first dielectric material to expand as the first dielectric material is converted to the second dielectric material.

11. The method of claim 8, wherein the second dielectric material has a lower density than the first dielectric material.

12. The method of claim 8, wherein the second dielectric material has a lower dielectric value (k-value) than the first dielectric material.

13. The method of claim 8, further comprising recessing the second dielectric material in the first trench, and wherein forming the gate structure comprises forming the gate structure over the recessed second dielectric material.

14. The method of claim 7, wherein forming the dielectric isolation further comprises:
conformally depositing a first dielectric material in a first trench between the first fin and the second fin using an atomic layer deposition (ALD) process;
after conformally depositing the first dielectric material, converting the first dielectric material to a second dielectric material;
after converting the first dielectric material to the second dielectric material, depositing a third dielectric material over the second dielectric material in the first trench, wherein after depositing the third dielectric material, the first trench is completely filled; and
after depositing the third dielectric material, recessing the second dielectric material such that an upper surface of the second dielectric material is lower than an upper surface of the first fin.

15. The method of claim 14, further comprising converting the third dielectric material to a fourth dielectric material.

16. A method of forming a semiconductor device, the method comprising:
forming a first fin and a second fin protruding from a substrate, a first sidewall of the first fin facing a second sidewall of the second fin, a width being from the first sidewall of the first fin to the second sidewall of the second fin, the width being less than 10 nm;
forming a dielectric isolation disposed between the first sidewall of the first fin and the second sidewall of the second fin, a top surface of the dielectric isolation being below a top of the first sidewall or the second sidewall, the dielectric isolation extending from the first sidewall of the first fin to the second sidewall of the second fin without a void therein, wherein the dielectric isolation is silicon oxycarbide nitride (SiOxCyNz) with an atomic ratio of oxygen to silicon (O:Si) in the dielectric isolation is in a range from 1.6 to 1.1 and with a concentration of carbon in the dielectric isolation is in a range from 3 atomic percent to 10 atomic percent; and
forming a gate structure disposed over the dielectric isolation and along and over the first sidewall of the first fin and the second sidewall of the second fin.

17. The method of claim 16, further comprising forming a third fin and a fourth fin protruding from the substrate, wherein forming the dielectric isolation comprises:
depositing a first dielectric material in a first trench between the first fin and the second fin and in a second trench between the third fin and the fourth fin using an atomic layer deposition (ALD) process;
after depositing the first dielectric material, converting the first dielectric material to a second dielectric material, wherein after converting the first dielectric material to the second dielectric material, the first trench is completely filled; and
after converting the first dielectric material to a second dielectric material, depositing a third dielectric material over the second dielectric material in the second trench.

18. The method of claim 17, wherein prior to converting the first dielectric material to the second dielectric material, the first trench is not completely filled.

19. The method of claim 17, further comprising converting the third dielectric material to a fourth dielectric material.

20. The method of claim 16, further comprising forming a third fin and a fourth fin protruding from the substrate, wherein forming the dielectric isolation comprises:
depositing a first dielectric material in a first trench between the first fin and the second fin and in a second trench between the third fin and the fourth fin using an atomic layer deposition (ALD) process;
depositing a second dielectric material over the first dielectric material in the second trench; and
after depositing the first dielectric material and depositing the second dielectric material, converting the first dielectric material to a third dielectric material and converting the second dielectric material to a fourth dielectric material.

* * * * *